United States Patent [19]

Schulz et al.

[11] Patent Number: 4,749,972
[45] Date of Patent: Jun. 7, 1988

[54] POWER LINE FILTER FOR 3-PHASE SYSTEMS

[75] Inventors: Hans-Werner Schulz, Munich; Ludwig Rogner, Regensburg, both of Fed. Rep. of Germany

[73] Assignee: Siemens Aktiengesellschaft, Berlin and Munich, Fed. Rep. of Germany

[21] Appl. No.: 60,269

[22] Filed: Jun. 10, 1987

[30] Foreign Application Priority Data

Jun. 20, 1986 [DE] Fed. Rep. of Germany ....... 3620761

[51] Int. Cl.$^4$ .......................... H03H 7/01; H05K 9/00
[52] U.S. Cl. ...................... 333/167; 333/181; 333/183; 333/185; 361/332
[58] Field of Search ........ 333/167, 168, 169, 181–185, 333/12, 175–177; 361/301, 306–308, 310, 331–334

[56] References Cited

U.S. PATENT DOCUMENTS

| | | | |
|---|---|---|---|
| 2,462,489 | 2/1945 | Hallett | 333/185 X |
| 3,681,612 | 8/1972 | Vogl et al. | 333/12 |
| 3,909,623 | 9/1975 | Wagner | 333/182 X |

Primary Examiner—Marvin L. Nussbaum
Attorney, Agent, or Firm—Hill, Van Santen, Steadman & Simpson

[57] ABSTRACT

A power line filter for 3-phase systems has a metallic filter housing which is subdivided by partitions into radio frequency sealed chambers. The chambers contain a power supply part, a first combination of feed through capacitors, attenuation elements, a second combination of feed through capacitors and a load connecting part. Phase conductors and a neutral conductor are connected through a respective annular feed through capacitor in the partition region from the power supply part to the first combination of feed through capacitors, and a similar connection is made between the second combination of feed through capacitors to the load connecting part. Phase feed through capacitors are provided per combination of feed through capacitors, and are accomodated in a feed through capacitor housing seated impact resistance in the filter housing. The annular feed through capacitor is arranged in the partition region and has one coating rigidly connected to the feed through capacitor housing and has its other coating connected to a metallic corregated hose which is conducted through this annular feed through capacitor. The metallic corregated hose carries a ring at its end facing the partition and is connected in a radio frequency sealed fashion to a sealing ring inserted in the partition.

11 Claims, 3 Drawing Sheets

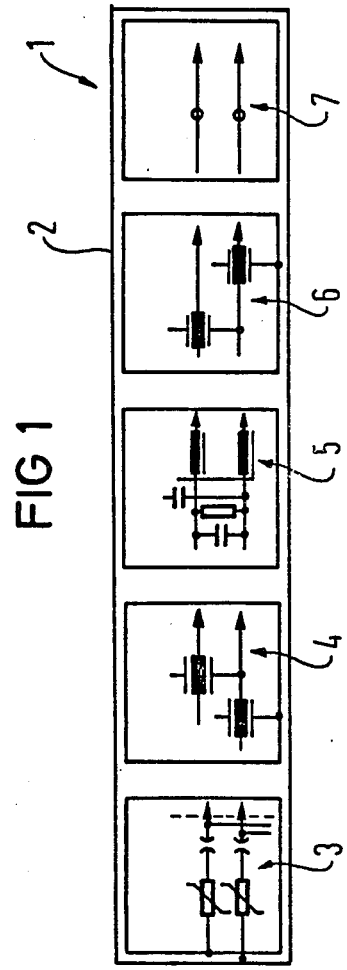
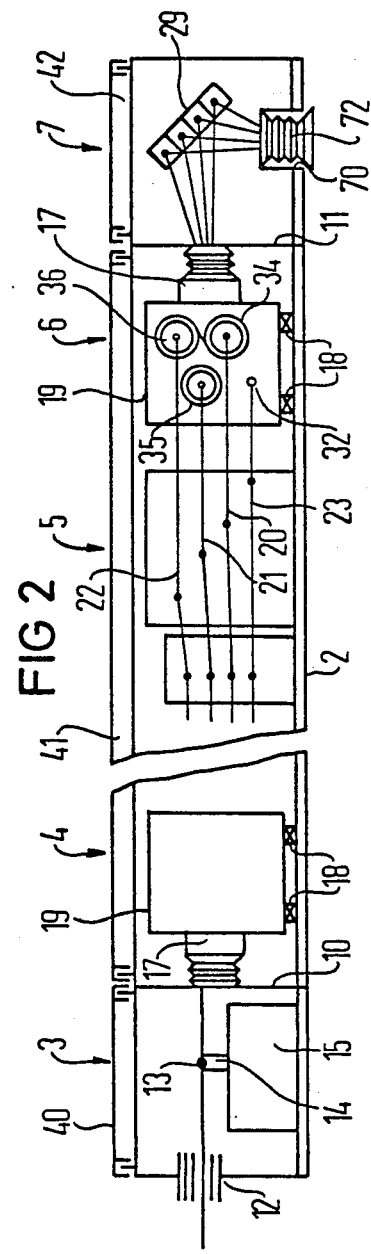

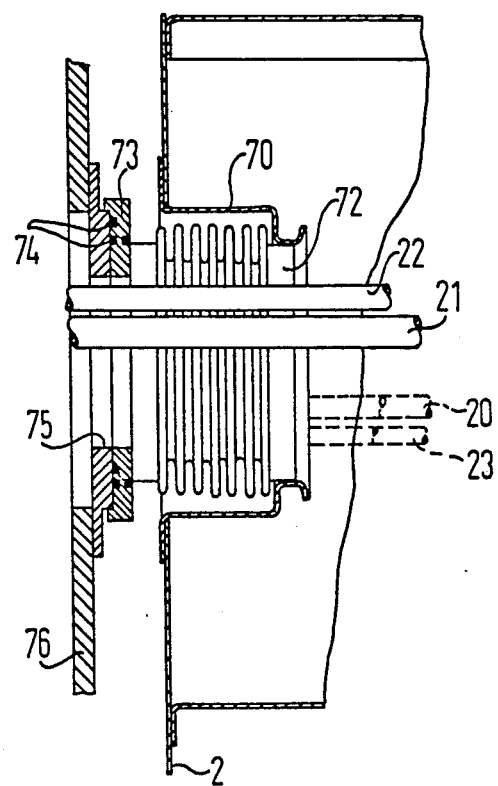

ial to the present invention>
POWER LINE FILTER FOR 3-PHASE SYSTEMS

BACKGROUND OF THE INVENTION

The present invention relates in general to power line filters and, in particular, to power line filters which have radio frequency sealed chambers.

Numerous types of power line filters are known in the prior art. The present invention provides an improvement over these prior art filters by providing a power line filter for 3-phase systems which has a metalic filter housing which is subdivided into radio frequency sealed chambers by partitions. The subdivided parts are a power supply part, a first combination of feed through capacitors, attenuation elements, a second combination of feed through capacitors and a load connection part accomodated in these chambers. The phase and the neutral conductors are each conducted through an annular feed through capacitor arranged in the partition region from the power supply part to the first combination of feed through capacitors and arranged between the second combination of feed through capacitors and the load connecting part.

SUMMARY OF THE INVENTION

It is an object of the present invention to create a modular power line filter with low leakage current which is distinguished by a broad suppression frequency range, simple assembly feasibility, cost beneficial manufacture, simple electrical connection, high resistance to vibration (greater than 5 g at 55 Hz) and resistance to impact (greater than 25 g).

In order to achieve this objective in a power line filter of the present invention, the novel power line filter has phase feed through capacitors for each feed through capacitor assembly which are accommodated in an additional housing which is seated impact resistant in the filter housing and hereinafter referred to as a feed through capacitor housing. An annular feed through capacitor is located between its respective partition and the feed through capacitor housing. It has one coating rigidly connected to the respective feed through capacitor housing and has its other coating connected to a metalic corregated hose which is conducted through the annular feed through capacitor. This metalic corregated hose carries a ring at its end facing the partition which is connected, particularly screwed, in a radio frequency sealed fashion to a sealing ring which is inserted into an aperture in the partition.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with accompanying drawings, in the several figures in which like reference numerals identify like elements, and in which:

FIG. 1 is a general block diagram of the novel power line filter;

FIG. 2 is a more detailed schematic representation of the FIG. 1 power line filter showing elements contained within the power line filter;

FIG. 5 is a cross sectional view of a radio frequency sealed connection for the conductors in a 3-phase system which is attached to the filter housing of the power line filter.

DESCRIPTION OF THE PREFERRED EMBODIMENT

Figure 3:
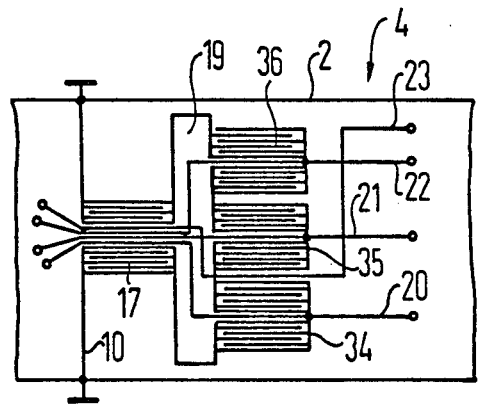
FIG. 3 is a schematic representation of the feed through capacitors used in the present invention.

The present invention has general applicability but is most advantageously utilized in a power line filter of the type shown in FIG. 1. FIG. 1 depicts a filter housing 2 of the power line filter 1. The filter housing 2 contains a power supply part 3, a first combination of feed through capacitors 4, an attentuating element 5 which contains the $\pi/b$ 2 elements necessary for high attentuations, a second combination of feed through capacitors 6 and a load connecting part 7. Five conductors, namely, three phase conductors, a neutral conductor and a grounded conductor are attached to the power line filter 1. The grounded conductor is directly connected to the filter housing. The three phase conductors and the neutral conductor are routed through the power line filter 1 as will be explained below.

The filter housing 2 of the power line filter 1 is divided by partitions into, for example, three chambers which are radio frequency shielded from one another. The power supply part and the load connecting part are accomodated in the first and last chambers, respectively, and the first and second combination of feed through capacitors and the attenuating elements connected between these are accomodated in the middle chamber.

The filter housing 2 is divided by partitions 10 and 11 into the three chambers which are radio frequency sealed relative to one another. These chambers are sealed in a radio frequency fashion by respective covers 40, 41 and 42 which include inserted radio frequency gaskets.

The first chamber 10 shown at the left in FIG. 2, comprises a connection opening 12 with a bending screw-type connection through which the three conductors 20, 21, 22 and the neutral conductor 23 are conducted to the filter connection 13. In the shortest possible connection, this connection lies at the ground of the filter housing 2 via a voltage dissipator 14 and varistor 15. From the filter connection 13, the phase and neutral conductors 20, 21, 22 and 23 pass through a bore in the metalic partition 10 and through an annular feed through capacitor 17 which is adjacent to the bore. The phase conductors 20, 21 and 22 then proceed through phase feed through capacitors 34, 35, 36, respectively. The combination of the phase feed through capacitors 34, 35 and 36 are accomodated in a metalic feed through capacitor housing 19 and is enclosed in a radio frequency sealed fashion and is seated impact and vibration proof in the metalic housing 2 by means of four buffers 18.

The phase feed through capacitors 34, 35, and 36 are aligned parallel to the longitudinal axis of the filter housing 2, whereby a significantly simplified connection between these capacitors and the filter connection 13 is created. Also obtained by this structure is an efficient interconnection between the phase feed through capacitors 34, 35, 36 and a connecting screw 32 located on the filter housing 2 for the neutral conductor 23 and the attenuators 5, namely the $\pi/2$ elements which follow the first combination 4 of feed through capacitors.

This simple interconnection is important particularly for power line filters having high currents and relatively inelastic series lines.

Figure 4:
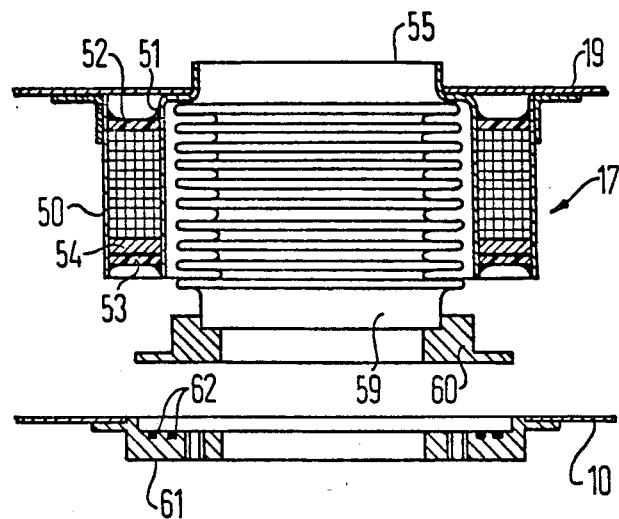
FIG. 4 is a cross sectional side view of an annular feed through capacitor used in the present invention.

In accordance with FIGS. 3 and 4, the annular feed through capacitor 17 is arranged between the partition 10 and the feed through capacitor housing 19. The annular feed through capacitor 17 is annularly shaped and concentrically embraces a metalic corregated hose 55. The inner coating 51 of the feed through capacitor 17 has its end facing the feed through capacitor 19 connected to the corresponding end of the corregated hose 55. This connection may be, for example, hard soldered, and has this end passing through a clearance in the feed through capacitor housing 19. The outer coating 50 of this capacitor 17 has its flange part facing the feed through capacitor housing 19 and aligned at a right angle to the capacitor 17 which is welded radio frequency tight to the feed through capacitor housing 19. The face ends of the capacitor 17 are insulated with casting resin wafers 52, 53, whereby the casting resin wafer 53 presses against the metalic face contacting wafer 52 and is shaped like an annular disk.

The end 59 of the corregated hose 55 facing the partition 10 carries a ring 60 equipped with a flange and with bores for screw tight connections. The ring 60 is screwable in radior frequency sealed fashion with a corresponding sealing ring 61 provided with threaded bores 66.

In order to guarantee the radio frequency sealed connection, the sealing ring 61 has annular grooves 62 in which radio frequency gaskets (not shown) are located. The sealing ring 61 may be welded to the partition 10.

Referring now to the circuit diagram, FIG. 3, one coating of these feed through capacitors 34, 35 and 36 is connected to the phase conductors 20, 21, and 22, respectively, so that these capacitors are connected between the phase conductors 20, 21 and 22 and the neutral conductor 23. This is grounded through the annular feed through capacitor 17, as shown in FIG. 3. An attenuation of the filter for frequencies up to more than 35 GHz (limit of measurement) has been greater than 100 dB.

As previously discussed, the first combination 4 of feed through capacitors are followed by attenuation elements 5, namely the $\pi/2$ elements, and are connected in a manner known in the art. The value of the inductances, capacitances and resistances is therefore based on the desired frequency range, namely toward the low frequencies. The attenuation elements 5 are in turn followed by a second combination 6 of phase feed through capacitors 34, 35 and 36 which is identical to the first combination already set forth above. As a result of identical structure, these combinations and their housings are interchangeable.

The phase conductors 20, 21 and 22 and the neutral conductor 23 are conducted through the annular feed through capacitor 17 of this second combination and through a corresponding passage in the partition 11 to a post strip 29 in the load connection part 7. They are also conducted to the outside of the housing filter 2 through a corregated hose 17 set into the filter housing 2 in a radio frequency sealed fashion.

As shown in FIG. 5, the filter housing 2 has a passage in the region of the load connection part 7 through which a metalic tube 70 enters into the inside of the filter housing 2. A metalic corregated hose 72 is contained in the metalic tube 70 which has its outer end welded to the filter housing 2 in a radio frequency sealed fashion. The metalic corregated hose 72 in turn has its end located on the inside of the filter housing 2 and welded to the corresponding, inner tube end. The outer end of the corregated hose 72 carries a ring 73 by means of which the corregated hose 72 can be attached, for example by screwing, to a sealing ring 75 which is set into an aperture of a wall 76 of a shielded space in a radio frequency sealed fashion. The ring 73 has annular grooves 74 into which a radio frequency gasket may be inserted.

As a result of the structure in FIG. 5, the power line filter and thus, the conductors are connectable in an impact-free and vibration-free fashion to the shielded space, so that the required radio frequency shielding is always established.

The power line filter is constructed in modular fashion, for which reason the individual units, that is, for example, the combinations of feed through capacitors together with housings, the attenuation elements and the like can be assembled outside of the filter housing and can be inserted in a radio frequency sealed fashion into the filter housing or, respectively, can be screwed thereto. Fabrication and assembly can thus be considerably simplified.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A power line filter for 3-phase systems having a metallic filter housing subdivided by first and second partitions into three radio frequency sealed chambers in which a first chamber contains a power supply part, a second chamber contains a first feed through capacitor assembly, attenuations elements, and a second feed through capacitor assembly and a third chamber contains a load connecting part all of which are accommodated in succession, whereby phase conductors and a neutral conductor are conducted through the first and second feed through capacitor assemblies from the power supply part through said first partition to the first assembly and from the second assembly through said second partition to the load connecting part, respectively, comprising for each of the feed through capacitor assemblies and their associated partition:

phase feed through capacitors contained in an additional feed through capacitor housing seated impact resistant in the filter housing;
   annular feed through capacitor located between its respective partition and said feed through capacitor housing having an outer coating connected to said feed through capacitor housing and an inner coating connected to and surrounding a metallic corregated hose conducted through said annular feed through capacitor, said metallic corregated hose carrying a securing ring on a first end facing said partition and opposed from a second end adjacent said feed through capacitor housing, said securing ring being screwably connected in a radio frequency sealed fashion to a sealing ring inserted in said partition.

2. A power line filter for 3-phase systems according to claim 1, wherein said phase feed through capacitors in said feed through capacitor housing are aligned perpendicular to a longitudinal axis of the filter housing.

3. A power line filter for 3-phase systems according to claim 1, wherein said sealing ring has annular grooves for the acceptance of a radio frequency gasket.

4. A power line filter for 3-phase systems according to claim 1, wherein said feed through capacitor housing is seated impact-free and vibration-free in the filter housing by means of buffers.

5. A power line filter for 3-phase systems according to claim 1, wherein said filter housing has a passage in the region of the load connecting part and wherein a metallic tube enters into the inside of the filter housing through said passage, an outer end of said metallic tube welded to the filter housing in a radio frequency sealed fashion, an additional metallic corregated hose contained in said metallic tube such that an inner end of said metallic corregated hose inside of the filter housing is connected to an inner end of said metallic tube in a radio frequency sealed fashion and such that an outer end of said metallic corregated hose carries a securing ring by means of which said metallic corregated hose is screwably connected to a sealing ring set into a wall of a shielded space in a radio frequency sealed fashion.

6. A power line filter for 3-phase systems having a metallic filter housing subdivided by first and second partitions into three radio frequency sealed chambers in which a first chamber contains a power supply part, a second chamber contains a first feed through capacitor assembly, attenuation elements, and a second feed through capacitor assembly and a third chamber contains a load connecting part all of which are accommodated in succession, whereby phase conductors and a neutral conductor are connected through the first and second feed through capacitor assemblies from the power supply part through said first partition to the first combination and from the second combination through said second partition to the load connecting plurality of phase feed through capacitors, connected part, comprising for each of the feed through capacitor assemblies and their associated partition: respectively to the phase conductors, contained in an additional feed through capacitor housing seated impact-resistant in the filter housing;

annular feed through capacitor located between its respective partition and said feed through capacitor housing having an outer coating connected to said feed through capacitor housing and surrounding an opening therein and having an inner coating;

metallic corregated hose conducted through and surrounded by said annular feed through capacitor and containing said phase conductors and said neutral conductor and connected to said inner coating of said annular feed through capacitor;

securing ring attached to an end of said metallic corregated hose on a first end facing said partition and opposed from a second end adjacent said feed through capacitor housing;

sealing ring releasable connectable to said securing ring in a radio frequency sealed fashion and inserted in an aperture in said partition.

7. A power line filter for 3-phase systems according to claim 6, wherein said phase feed through capacitors, said annular feed through capacitors, said metallic corregated hose and said securing and sealing rings form said feed through capacitor assemblies.

8. A power line filter for 3-phase systems according to claim 6, wherein said phase feed through capacitors in said feed through capacitor housing are aligned perpendicular to a longitudinal axis of the filter housing.

9. A power line filter for 3-phase systems according to claim 6, wherein said selaing ring has annular grooves for the acceptance of radio frequency gaskets.

10. A power line filter for 3-phase system according to claim 6, wherein said feed through capacitor housing is seated impact-free and vibration-free in the filter housing by means of buffers.

11. A power line filter for 3-phase systems according to claim 6, wherein said filter housing has a passage in the region of the load connected part and wherein a metallic tube enters into the inside of the filter housing through said passage, an outer end of said metallic tube welded to the filter housing in a radio frequency sealed fashion, an additional metallic corregated hose contained in said metallic tube such that an inner end of said metallic corregated hose inside of the filter housing is connected to an inner end of said metallic tube in a radio frequency sealed fashion and such that an outer end of said metallic corregated hose carries a securing ring by means of which said metallic corregated hose is screwably connected to a sealing ring set into a wall of a shielded space in a radio frequency sealed fashion.

* * * * *